United States Patent
Sander

[11] Patent Number: 6,118,308
[45] Date of Patent: Sep. 12, 2000

[54] CIRCUIT CONFIGURATION FOR A COMPARATOR

[75] Inventor: Rainald Sander, München, Germany

[73] Assignee: Siemens Aktiengesellschaft, Munich, Germany

[21] Appl. No.: 09/275,374

[22] Filed: Mar. 24, 1999

[30] Foreign Application Priority Data

Mar. 24, 1998 [DE] Germany .................. 198 12 918

[51] Int. Cl.[7] .................................................. H03K 5/153
[52] U.S. Cl. .................................. 327/66; 327/80; 327/89
[58] Field of Search .............................. 327/53, 52, 63, 327/65, 66, 77, 80, 81, 89

[56] References Cited

U.S. PATENT DOCUMENTS

| | | | |
|---|---|---|---|
| 4,047,059 | 9/1977 | Rosenthal | 327/66 |
| 4,507,572 | 3/1985 | Hashimoto et al. | 330/277 |
| 5,488,321 | 1/1996 | Johnson | 327/66 |
| 5,812,022 | 9/1998 | Hirano et al. | 327/66 |
| 5,898,323 | 4/1999 | Suda | 327/66 |

*Primary Examiner*—Toan Tran
*Attorney, Agent, or Firm*—Herbert L. Lerner; Laurence A. Greenberg; Werner H. Stemer

[57] ABSTRACT

A circuit configuration for a comparator provides that first and second transistors on an input side are connected jointly by their two control terminals to a first input terminal, and that the first and second transistors have different cutoff voltages. Such a circuit configuration has the advantage that at a zero-volt input voltage, no current is consumed. The circuit configuration can be connected directly to a high-voltage supply without the aid of regulating voltages or high-precision reference voltages.

12 Claims, 2 Drawing Sheets

$V_{TH1} > V_{TH2}$ $V_{TH1} > V_{TH2}$

CIRCUIT CONFIGURATION FOR A COMPARATOR

BACKGROUND OF THE INVENTION

Field of the Invention

The invention relates to a circuit configuration for a comparator having a first and second transistor connected to input and output terminals.

Such a circuit configuration for a comparator is well known. The comparator substantially includes an input-side differential amplifier with two transistors, whose load paths are connected to a reference potential on the one hand via a current source configuration and are connected by their respectively other terminals to output terminals via a current mirror configuration. The control terminal of one of the two transistors is connected to the input terminal of the comparator circuit for applying an input voltage.

Conversely, the control terminal of the other transistor is typically connected to a reference potential. Two different voltage levels can be picked up at the output terminals of the comparator circuit, depending on whether the input voltage applied to the input terminals is selected to be higher or lower than the reference voltage.

Comparator circuits are generally used to detect a voltage with respect to a reference potential. As soon as the voltage to be detected exceeds a predetermined value, the so-called threshold voltage, a signal can be picked up at the output of the comparator that indicates the exceeding of the threshold voltage, which can for instance be the aforementioned reference voltage. If conversely the threshold voltage is not reached by the input voltage at the comparator, the output of the comparator outputs a different output, so that undershooting of the threshold voltage is also signaled unambiguously at the output of the comparator.

One problem in many comparator circuits is the fact that even if no input voltage is present at the input terminals, they still consume current and thus require a constant power supply. Furthermore, the known comparator circuits are typically not connected directly to a high-voltage supply and require regulating voltages or high-precision reference voltages to function.

SUMMARY OF THE INVENTION

It is accordingly an object of the invention to provide a circuit configuration for a comparator that overcomes the above-mentioned disadvantages of the prior art devices of this general type, which at an input voltage of zero volts consumes no current and can be connected directly to a high-voltage supply. Furthermore, the circuit configuration for the comparator does not require any regulating voltages or high-precision reference voltages and should nevertheless function reliably.

With the foregoing and other objects in view there is provided, in accordance with the invention, a comparator, including: input terminals including a first input terminal and a second input terminal; output terminals including a first output terminal and a second output terminal; a first transistor has a control terminal and a first cutoff voltage, the first transistor is connected to the first input terminal; a second transistor has a control terminal and a second cutoff voltage being different than the first cutoff voltage, the second transistor is connected to the first input terminal; a current source connects the first transistor and the second transistor to a reference potential; and a current mirror configuration is connected between the first and second transistors and the output terminals.

Thus the circuit configuration of the invention is based essentially on the fact that the control terminals of the two transistors on the input side are connected to the first input terminal. It is also provided according to the invention that the two transistors on the input side of the circuit configuration have different cutoff voltages. Therefore, one of the two transistors has a cutoff voltage lower than that of the other transistor. The term cutoff voltage is understood to be the voltage that must be applied to the control terminal of the transistor in order that the transistor will be turned on or made conducting. In MOS transistors, the input voltage is also called the threshold voltage or "pinch-off voltage". The cutoff voltage can for instance be varied by the size of the electrode of the transistor.

The circuit configuration of the invention for a comparator exploits the fact that when initially low input voltages are applied to the input terminals of the circuit configuration, only one of the two transistors on the input side of the circuit configuration begins to conduct, or is more conductive than the other transistor.

In an embodiment of the invention, the two transistors on the input side are each MOS transistors. The MOS transistors each have respective substrate terminals, which are connected to different potentials. For instance, the MOS transistor having the higher cutoff voltage is connected by its substrate terminal to the aforementioned current source, while the MOS transistor with the lower cutoff voltage has its substrate terminal at reference potential and thus a lower potential is applied to it. The different potentials at the two substrate terminals of the transistors on the input side assure that as the input voltage at the input terminals of the circuit configuration becomes higher, the conductivity of the transistor on the input side that has the lower cutoff voltage, compared with the other transistor on the input side, becomes greater. The current mirror configuration on the output side of the circuit configuration furnishes a digital output voltage to one of the output terminals, and as the input voltage rises the output voltage switches from a first level to a second, higher lever.

In a refinement of the invention, the current mirror configuration includes two MOS transistors or two bipolar transistors, of which one of the transistors in each case is switched as a diode. To limit the voltages at the current mirror configuration, Zener diodes can be connected parallel to the load paths of each of these two transistors.

If the circuit configuration is supplied with a high voltage, then the two transistors on the input side should each be embodied as high-voltage transistors.

In the case of input voltages at the input terminals that are less than the cutoff voltage of the transistor on the input side that has the lower cutoff voltage, no current flows through the current mirror configuration. In order nevertheless to define the output level at the output terminals in a fixed way, according to the invention an ohmic connection, such as a resistor or a current source, to a reference potential that represents the logical "low" level, is furnished.

The circuit configuration of the invention can be embodied either as a noninverting comparator or as an inverting comparator.

Other features which are considered as characteristic for the invention are set forth in the appended claims.

Although the invention is illustrated and described herein as embodied in circuit configuration for a comparator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
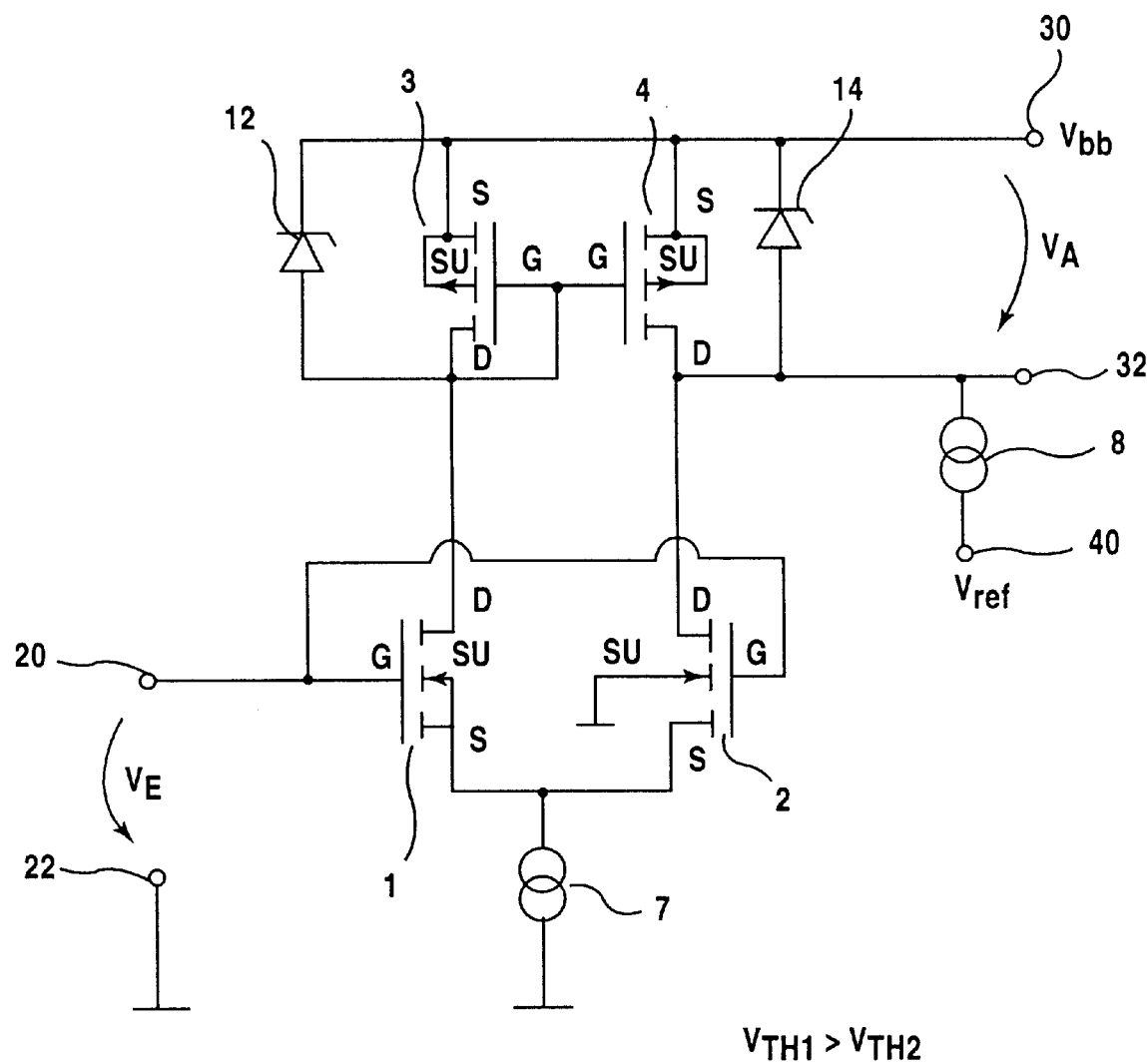
FIG. 1 is a diagrammatic schematic diagram of a first exemplary embodiment of a comparator circuit according to the invention.
Figure 1:
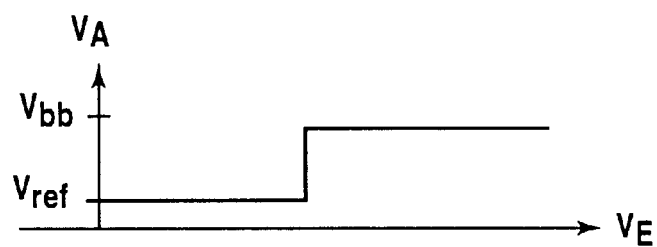

In all the figures of the drawing, sub-features and integral parts that correspond to one another bear the same reference symbol in each case. Referring now to the figures of the drawing in detail and first, particularly, to FIG. 1 thereof, there is shown a first exemplary embodiment of a circuit configuration for a comparator according to the invention. The circuit configuration has a first MOS transistor 1, a second MOS transistor 2, a third MOS transistor 3, and a fourth MOS transistor 4. The MOS transistors 1, 2 in the exemplary embodiment are n-channel enhancement MOSFETs, and the MOS transistors 3, 4 are p-channel enhancement MOSFETs. The MOS transistors 1, 2, 3 and 4 are connected as follows.

Control terminals and hence gate terminals G of the first and second MOS transistors 1, 2 are connected to an input terminal 20. Two source terminals S of the first MOS transistor 1 and second MOS transistor 2 are connected to a reference potential via a current source 7. A second input terminal 22 is also applied to the reference potential. Two drain in terminals D of the first MOS transistor 1 and the second MOS transistor 2 are connected to a current mirror configuration made up of the two MOS transistors 3, 4. In detail, for this purpose, the drain terminal D of the first MOS transistor 1 is in contact with the drain terminal D of the third MOS transistor 3. The source terminal S of the third MOS transistor 3 is connected to a first output terminal 30. A gate terminal G of the third MOS transistor 3 is connected on the one hand to a drain terminal D of the first MOS transistor 1 and on the other to a gate terminal G of the fourth MOS transistor 4. The source terminal S of the fourth MOS transistor 4 is also connected to the first output terminal 30. The drain terminal D of the fourth MOS transistor 4 is connected to the drain terminal D of the second MOS transistor 2 and to a second output terminal 32.

The MOS transistors 1, 2, 3 and 4 shown in the exemplary embodiment of FIG. 1 each have substrate terminals SU. With the exception of the substrate terminal SU of the second MOS transistor 2, the other substrate terminals SU are connected to the associated source terminal S of the respective MOS transistor 1, 3 and 4. The substrate terminal SU of the MOS transistor 2 is connected to the reference potential and thus to a lower potential than the substrate terminal SU of the first MOS transistor 1. The second output terminal 32 of the circuit configuration of FIG. 1 is also connected to a reference potential $V_{ref}$ via an ohmic connection, in this case a current source 8. The reference potential $V_{ref}$ is furnished at a terminal 40 of the circuit configuration. A voltage supply $V_{bb}$ of the circuit configuration should be applied to the first output terminal 30. Finally, the circuit configuration also has two Zener diodes 12, 14, which are each connected parallel to respective load paths of the MOS transistors 3, 4. The Zener diodes 12 and 13 serve to limit the voltage at the current mirror configuration. Cathode terminals of the two Zener diodes 12, 14 are each applied to the first output terminal 30.

The mode of operation of the circuit configuration of a comparator shown in FIG. 1 is as follows.

The MOS transistors 1, 2, together with the current source 7, form the characteristic input for comparators of the circuit configuration. However, in contrast to the usual comparator circuits, both the gate terminal G of the first MOS transistor 1 and the gate terminal G of the second MOS transistor 2 are connected to the first input terminal 20. Also in contrast to conventional comparator circuits, for the circuit configuration presented here it is compulsory that the cutoff voltage or threshold voltage $U_{TH1}$ of the first MOS transistor 1 be selected as greater than the cutoff voltage or threshold voltage $U_{TH2}$ of the second MOS transistor 2. The result of this is as follows.

An input voltage $U_E$ is applied to the input terminals, 20, 22. At a low input voltage $U_E$ because of the aforementioned prescribed dimensioning, the second MOS transistor 2 will initially be more conductive than the first MOS transistor 1. As the input voltage $U_E$ then increases, however, the conductivity of the first MOS transistor 1 becomes greater compared to the conductivity of the second MOS transistor 2, since the second MOS transistor 2, via its substrate control, becomes higher in impedance. The current mirror configuration with the third and fourth MOS transistors 3, 4 furnishes a digital output voltage $U_A$ between the output terminals 30, 32, which as the input voltage $U_E$ rises switches from "low" to "high". The corresponding transfer function is sketched in FIG. 1, at the bottom. The function is equivalent to that of a noninverting comparator.

If the input voltage $U_E$ is below the cutoff voltage $U_{TH2}$ of the second MOS transistor 2, advantageously no current flows through the current mirror configuration containing the two MOS transistors 3, 4. In order nevertheless to define the output level of the output voltage $U_A$ between the output terminals 30, 32 in a defined way, the ohmic connection, in this case the current source 8, to a logical "low" level, in this case $V_{ref}$, is provided.

Figure 2:
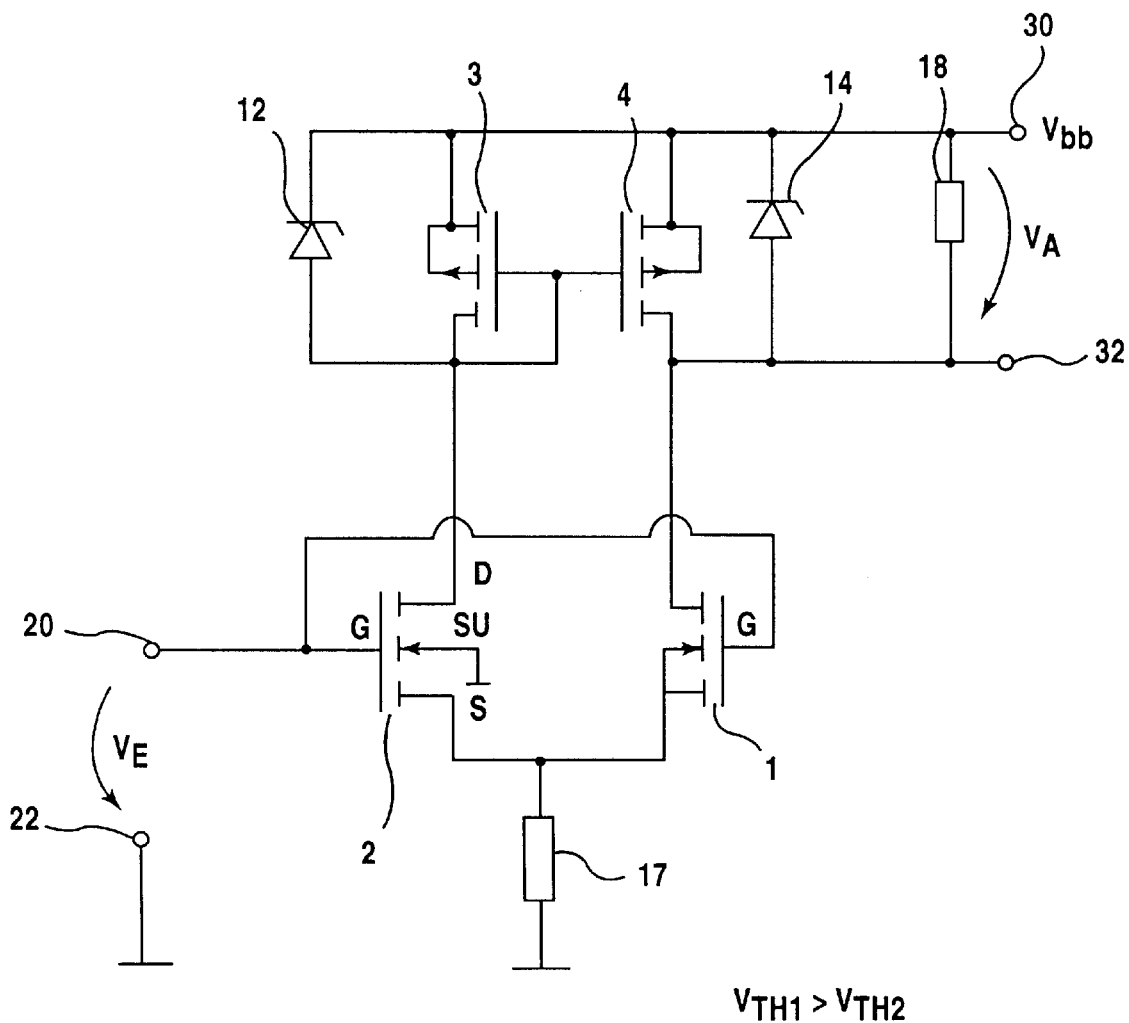
FIG. 2 is a schematic diagram of a second exemplary embodiment of the comparator circuit.
Figure 2:
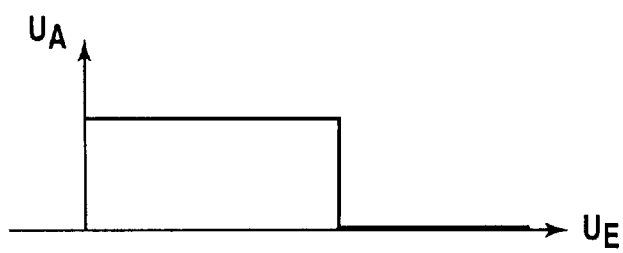

In FIG. 2, an exemplary embodiment of an inverting comparator is shown. The transfer characteristic curve pertaining to it is sketched schematically in FIG. 2 at the bottom. It can easily be seen that at low input voltages $U_E$, an output voltage $U_A$ with a "high" input level is furnished, while at higher input voltages $U_E$, an output voltage $U_A$ with a "low" level is furnished to the output terminals 30, 32.

To realize this transfer function, the two first and second MOS transistors 1, 2 presented in conjunction with the circuit configuration of FIG. 1 are transposed. Therefore, the first MOS transistor 1 with the higher cutoff voltage $U_{TH1}$ is connected to the fourth MOS transistor 4 of the current mirror configuration, and the second MOS transistor 2 with the lower cutoff voltage $U_{TH2}$ is connected to the third MOS transistor 3 of the current mirror configuration.

In the exemplary embodiment of the circuit configuration of FIG. 2, the current source 7 presented in conjunction with FIG. 1 is replaced by an ohmic resistor 17. Instead of the current source 8 presented in FIG. 1, an ohmic resistor 18 is now provided, which is connected between the two output terminals 30, 32.

I claim:

1. A comparator, comprising:

input terminals including a first input terminal and a second input terminal;

output terminals including a first output terminal and a second output terminal;

a first transistor having a control terminal and a first cutoff voltage, said first transistor connected to said first input terminal;

a second transistor having a control terminal and a second cutoff voltage being different than said first cutoff voltage, said second transistor connected to said first input terminal;

a current source connecting said first transistor and said second transistor to a reference potential; and a current mirror configuration connected between said first and second transistors and said output terminals.

2. The comparator according to claim 1, wherein said first transistor and said second transistor are MOS transistors.

3. The comparator according to claim 2, wherein said first and second transistors each have a substrate terminal, said substrate terminal of said first and second transistors having a higher cutoff voltage is connected to said current source, and said substrate terminal of the other transistor connected to the reference potential.

4. The comparator according to claim 1, wherein said current mirror configuration includes a third transistor and a fourth transistor, said third transistor connected as a diode, said third transistor and said fourth transistor each having a load path respectively connected between said first output terminal and said first and second transistors, and a junction of said fourth transistor with one of said first and second transistors is connected to said second output terminal.

5. The comparator according to claim 4, wherein said third transistor and said fourth transistor are MOS transistors.

6. The comparator according to claim 4, wherein said third transistor and said fourth transistor are bipolar transistors.

7. The comparator according to claim 4, including a Zener diode connected parallel to said load path of said third transistor and a further Zener diode connected parallel to said load path of said fourth transistor.

8. The comparator according to claim 1, wherein said current source is an ohmic resistor.

9. The comparator according to claim 1, including a ohmic connection connecting said second output terminal to a further reference potential.

10. The comparator according to claim 9, wherein said ohmic connection is selected from the group consisting of a current source and a resistor.

11. The comparator according to claim 1, including an ohmic connection connecting said first and second output terminals to one another.

12. The comparator according to claim 11, wherein said ohmic connection is selected from the group consisting of a current source and a resistor.

* * * * *